(12) United States Patent
Wang et al.

(10) Patent No.: US 7,044,601 B2
(45) Date of Patent: May 16, 2006

(54) MULTIFOCAL OPTICAL DEVICE DESIGN

(75) Inventors: Jing Wang, Minneapolis, MN (US); Fadil Santosa, St. Louis Park, MN (US); Robert D. Gulliver, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 11/186,468

(22) Filed: Jul. 21, 2005

(65) Prior Publication Data

US 2005/0254007 A1    Nov. 17, 2005

Related U.S. Application Data

(62) Division of application No. 10/656,690, filed on Sep. 5, 2003.

(51) Int. Cl.
*G02C 7/02* (2006.01)

(52) U.S. Cl. .................................. 351/177; 351/169
(58) Field of Classification Search ................ 351/169, 351/177
See application file for complete search history.

(56) References Cited

U.S. PATENT DOCUMENTS

| | | | |
|---|---|---|---|
| 5,805,260 A | | 9/1998 | Roffman et al. |
| 5,861,935 A | * | 1/1999 | Morris et al. ................ 351/169 |
| 6,019,470 A | | 2/2000 | Mukaiyama et al. |
| 6,102,544 A | | 8/2000 | Baudart et al. |
| 6,241,355 B1 | | 6/2001 | Barsky |
| 6,302,540 B1 | | 10/2001 | Katzman et al. |
| 6,382,789 B1 | | 5/2002 | Baudart et al. |
| 6,390,623 B1 | | 5/2002 | Kokonaski et al. |
| 6,776,486 B1 | * | 8/2004 | Steele et al. ................ 351/169 |
| 6,802,606 B1 | | 10/2004 | Roffman et al. |
| 2004/0008320 A1 | | 1/2004 | Shirayanagi |
| 2004/0099972 A1 | | 5/2004 | Morris et al. |

FOREIGN PATENT DOCUMENTS

| | | |
|---|---|---|
| EP | 0744646 A1 | 11/1996 |
| ES | 2013548 | 5/1990 |

OTHER PUBLICATIONS

"International Search Report for PCT Application PCT/US2004/028771", (Feb. 17, 2005),4 pgs.
Loos, J., et al., "A Variational Approach to Progressive Lens Design", *Computer Aided Design*, 30(8), (1998),595-602.

* cited by examiner

*Primary Examiner*—Jordan M. Schwartz
(74) *Attorney, Agent, or Firm*—Schwegman, Lundberg, Woessner & Kluth, P.A.

(57) ABSTRACT

Multifocal optical device designs receive input parameters to specify a desired power distribution function, a power deviation weight function, and an astigmatism weight function over the design field. A fourth-order partial differential variational equation is linearized by defining the optical surface in terms of perturbations from a base surface such as a sphere or a toric. The solution may be expressed as piecewise quadratic splines superposed over a triangulation of the field. Evaluation of the surface may use a set of tensor-product splines. An astigmatic base surface permits both multiple magnifying powers and a prescribed astigmatism correction in a single optical surface.

54 Claims, 12 Drawing Sheets

$$\left. \begin{array}{l} mx-i=0 \\ ny-i=0 \\ ny-mx-i=0 \\ ny+my-i=0 \end{array} \right\} 402$$

MULTIFOCAL OPTICAL DEVICE DESIGN

RELATED APPLICATIONS

This application is a divisional of U.S. patent application Ser. No. 10/656,690, filed Sep. 5, 2003, which is incorporated by reference herein.

TECHNICAL FIELD

The present invention relates to computer-implemented methods and systems for designing optical devices, and particularly concerns the design of multifocal devices such as progressive ophthalmic lenses.

BACKGROUND

Multifocal optical devices find utility in a number of technologies. For example, bifocal and trifocal lenses treat presbyopia caused by loss of accommodative power of the eye. Progressive addition lenses for this purpose include a far-view zone with a low power for distance vision and a near-view zone with higher power for reading and other close work. The power increases progressively and smoothly in an intermediate zone or corridor between the far and near zones. Normally, the near zone lies near the bottom center of the lens, below the far zone; however, other arrangements satisfy specialized purposes.

Lens design generates a specification of surface points that a grinder can produce from a lens blank. Modern lens grinders are numerically controlled machines that abrade the front and/or back surfaces of the blank according to design data specifying various points on the surface. Some lenses may alternatively be produced by plastic casting or other techniques. Both the front and back surfaces of a lens may have magnifying power; the effective power is approximately the difference between the powers of the two surfaces. Power at any point is related to the sum of a surface's curvatures in two perpendicular directions.

Astigmatism is normally an undesirable property of lenses that causes distortion and color fringing. Astigmatism, sometimes called "cylinder," is related to the difference between the lens curvatures in different directions. While a single power lens can theoretically have zero astigmatism everywhere, a lens having different powers at different locations necessarily has at least some astigmatism. A major goal in designing progressive lenses is to reduce astigmatism, especially in the region of the far, near, and intermediate zones. Secondary zones outside this region are less critical, although astigmatism reduction there is still important.

Computer-aided design of progressive lens and similar devices have employed both direct and indirect methods. A direct method first prescribes a selected distribution of curvatures on a vertical meridian line that follows the eye's up-down motion. Prescribed horizontal curves across the meridian are chosen to have the desired curvatures where they cross the meridian. Direct methods usually result in a high astigmatism level with little control over the astigmatism in different areas of the lens surface.

Indirect methods balance a desired power distribution with the unavoidable astigmatism produced. A variational approach iterates toward the solution of a full non-linear fourth-order Euler-Lagrange partial differential equation. Another approach attempts to minimize a defined cost function with an optimization algorithm. The cost function attains a low value when the desired lens properties are approached. One such method specifies a desired power distribution over an entire lens surface, then constructs a surface close to this distribution while optimizing to achieve low weighted amounts of astigmatism. Free-energy analogies and variational approaches have also been investigated. Indirect methods involve the solution of fourth-order non-linear elliptic equations, which involve very large amounts of computation—up to several hours for a single lens design.

A lens design may deliberately include an astigmatic or cylinder component to correct for astigmatism in the wearer's eyes. Integrating the magnifying-power correction and the astigmatism or cylinder correction in the same surface of a lens or other optical device is desirable. Single-power lens conventionally fabricate both corrections in the same surface of a toric (or atoric) lens. However, progressive design techniques have heretofore not integrated astigmatism correction, and fabricating the two corrections sequentially on the same surface would unacceptably thin the lens or device. Conventional methods therefore fabricate the progressive component on one surface (usually the front), and the astigmatism correction on the other surface. Although this makes the two corrections approximately independent of each other, some offset errors still exist, and structural weakness may still occur, especially in currently fashionable thin, light ophthalmic lenses.

SUMMARY OF THE INVENTION

We offer an indirect way to design progressive optical devices that reduces computation time for accurate powers and small undesired astigmatism. Input parameters comprise a prescribed power distribution, a weight function for power deviation, and one for astigmatism. We solve a linearized variational equation as perturbations over a base surface, and may express the solution in terms of superposed low-degree splines.

Another aspect of the invention permits progressive-power and astigmatism corrections in the same optical surface by incorporating a prescribed cylinder into the base surface.

DRAWING

FIGS. 1A–E depict an example of a progressive lens design according to an embodiment of the invention.

Figure 5A:
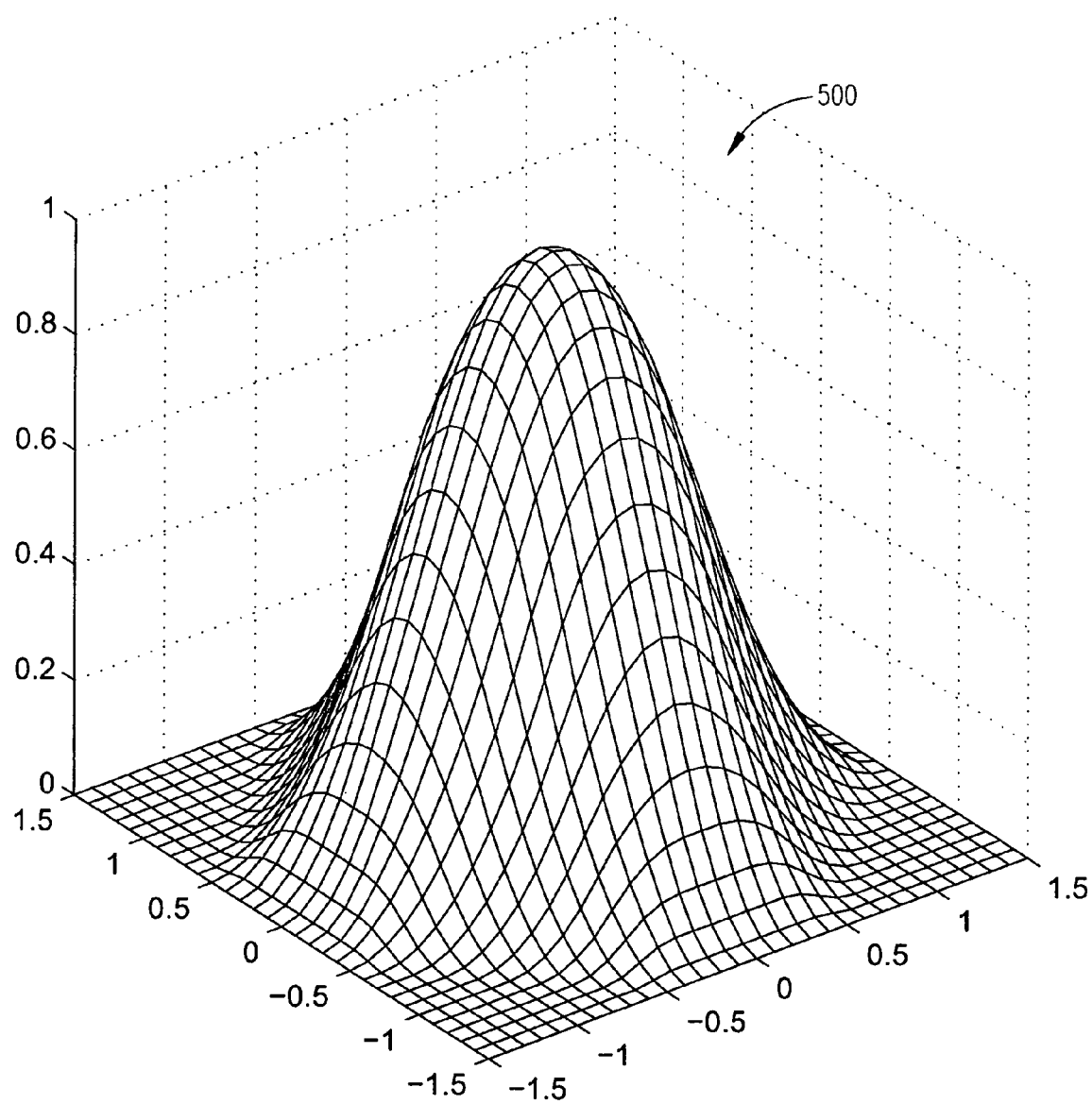
Figure 5B:
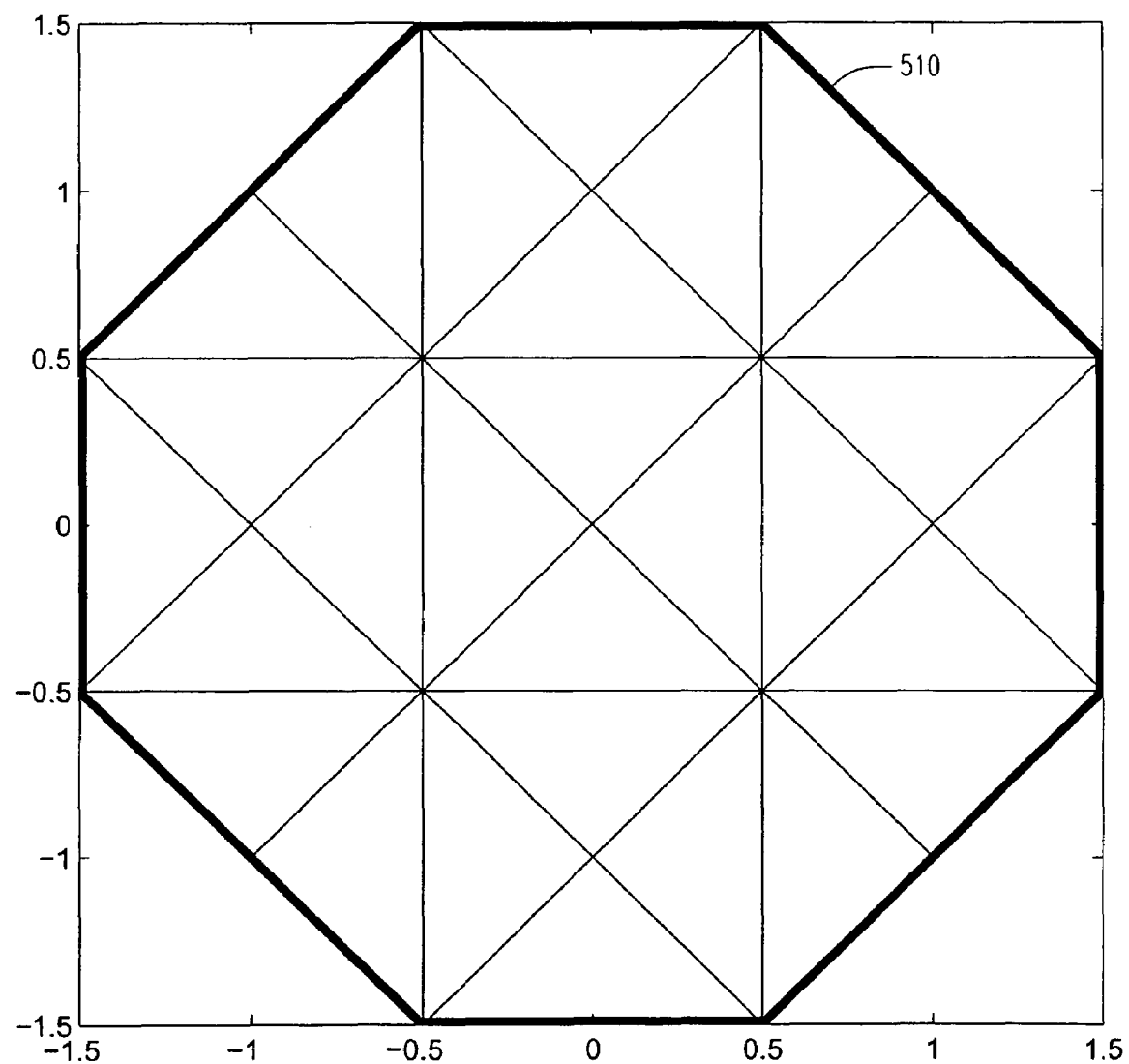

FIGS. 5A–B show a spline function.

Figure 6A:
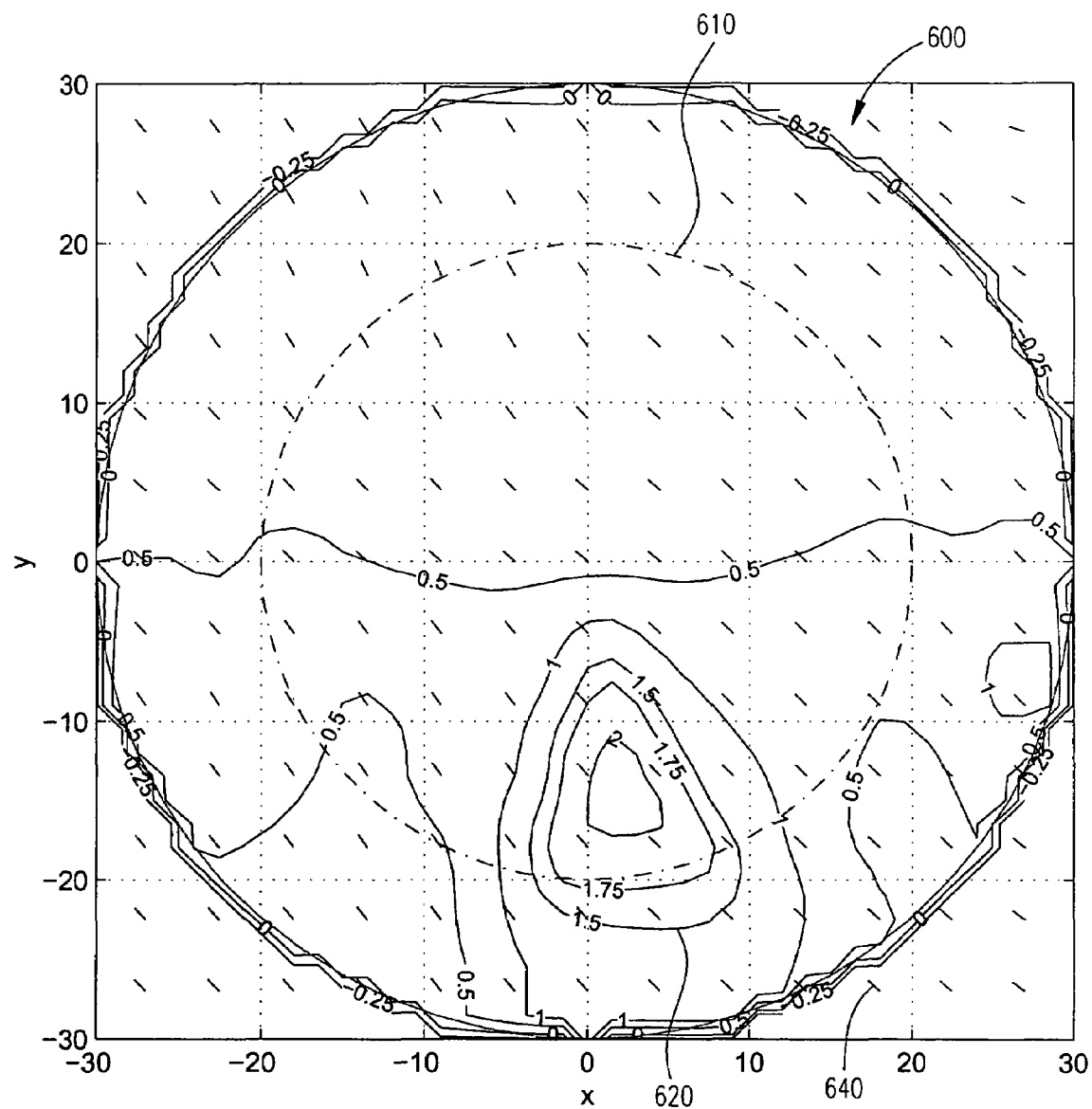
Figure 6B:
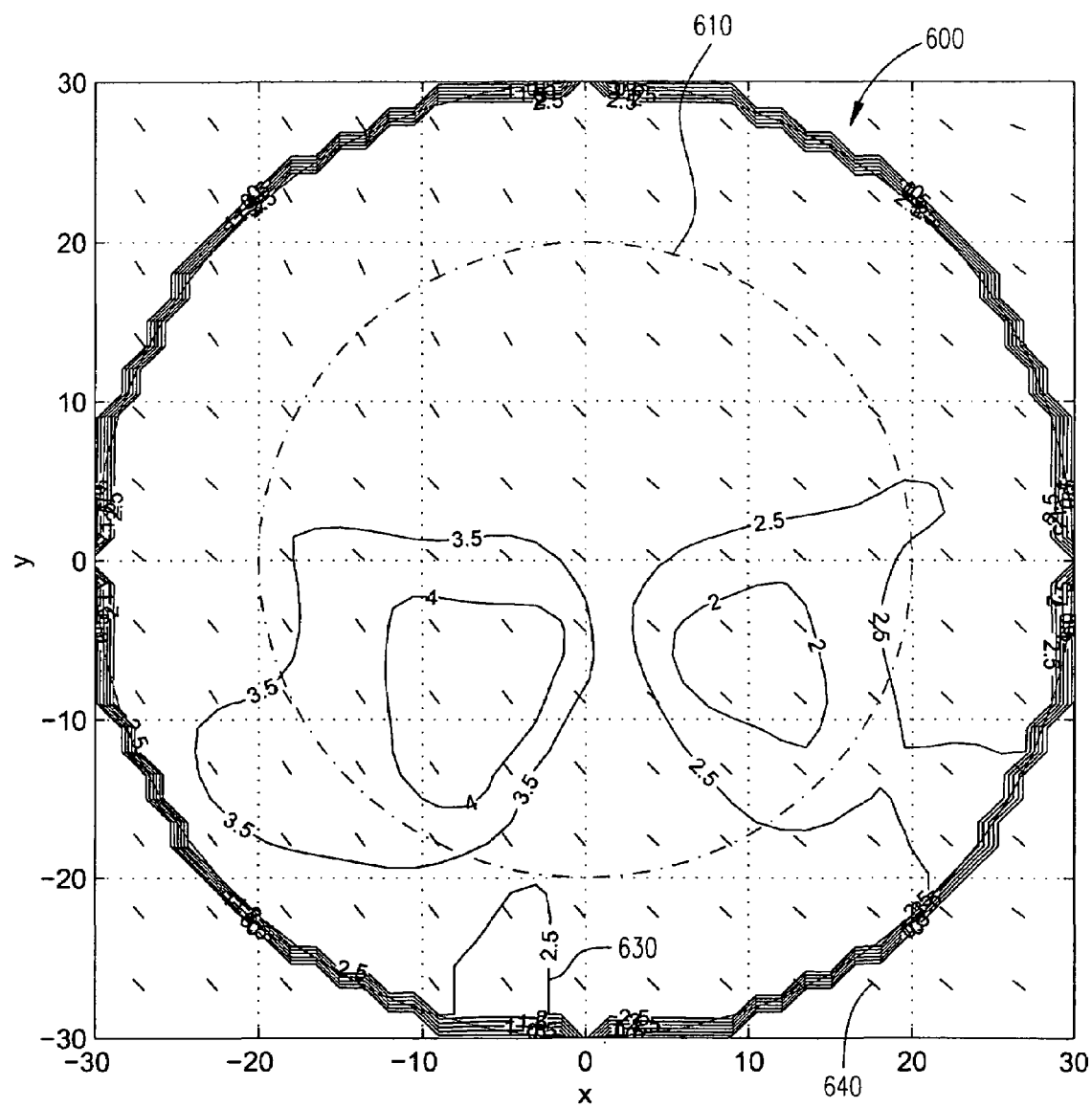

FIGS. 6A–B depict an example of a progressive lens design incorporating astigmatism correction.

Figure 7:
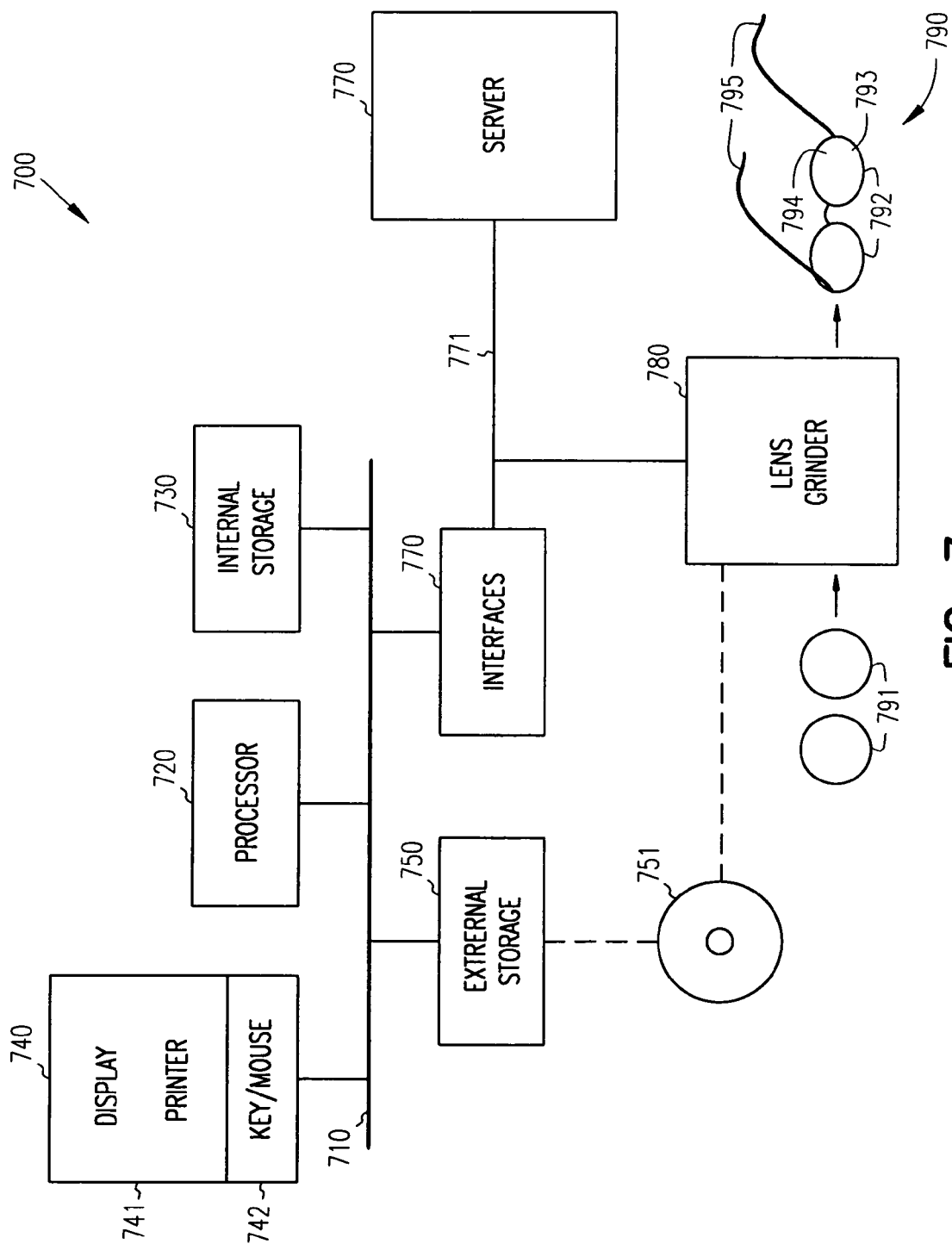

FIG. 7 is a block diagram of a system for hosting the invention.

DETAILED DESCRIPTION

Progressive Correction

FIG. 1 shows an example ophthalmic progressive addition lens (PAL) 100 inside an edge 110. This lens typifies designs made with our procedure, although other optical devices can be produced in a similar manner. The coordinate axes denote millimeters from the center of the lens. FIG. 1A includes contour lines 120 having constant optical power. The mean power of an optical surface at a point x,y is proportional to the sum of the curvatures in two perpendicular directions at that point; the mean curvature is defined as $H(x,y)=(k_1(x,y)+k_2(x,y))/2$. In the example lens 100, the add power is 0.00 diopter in the far-view upper part of the lens. The near-view add power is 2.0 diopters in the bottom center of the lens. ("Add power" is the power that must be added to the far-view power to obtain the desired near-view power; in this example, the base or far-view power is 4.94.) A vertical corridor between the near-view and far-view portions has powers intermediate the two specified powers.

Figure 1A:
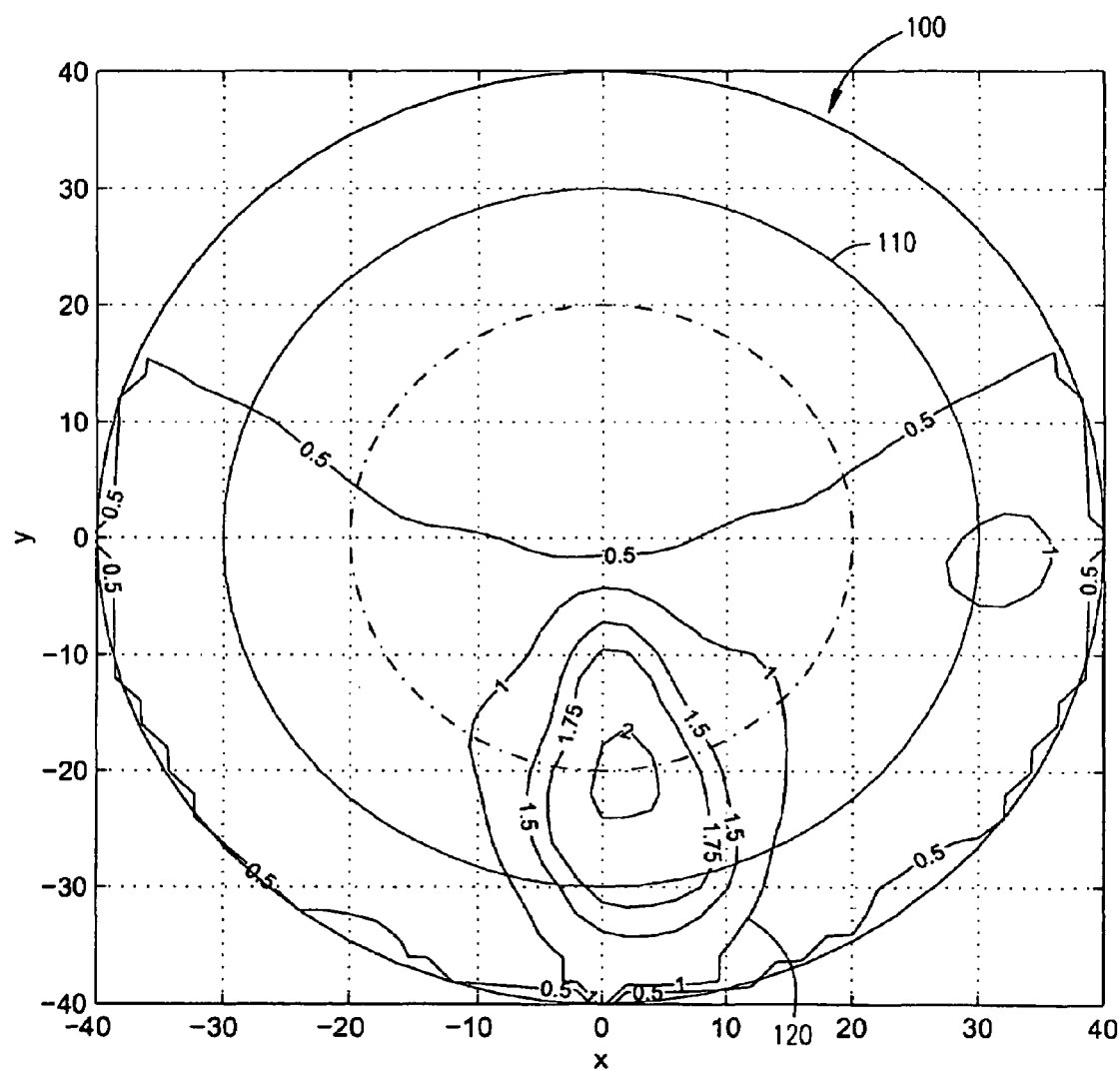
Figure 1B:
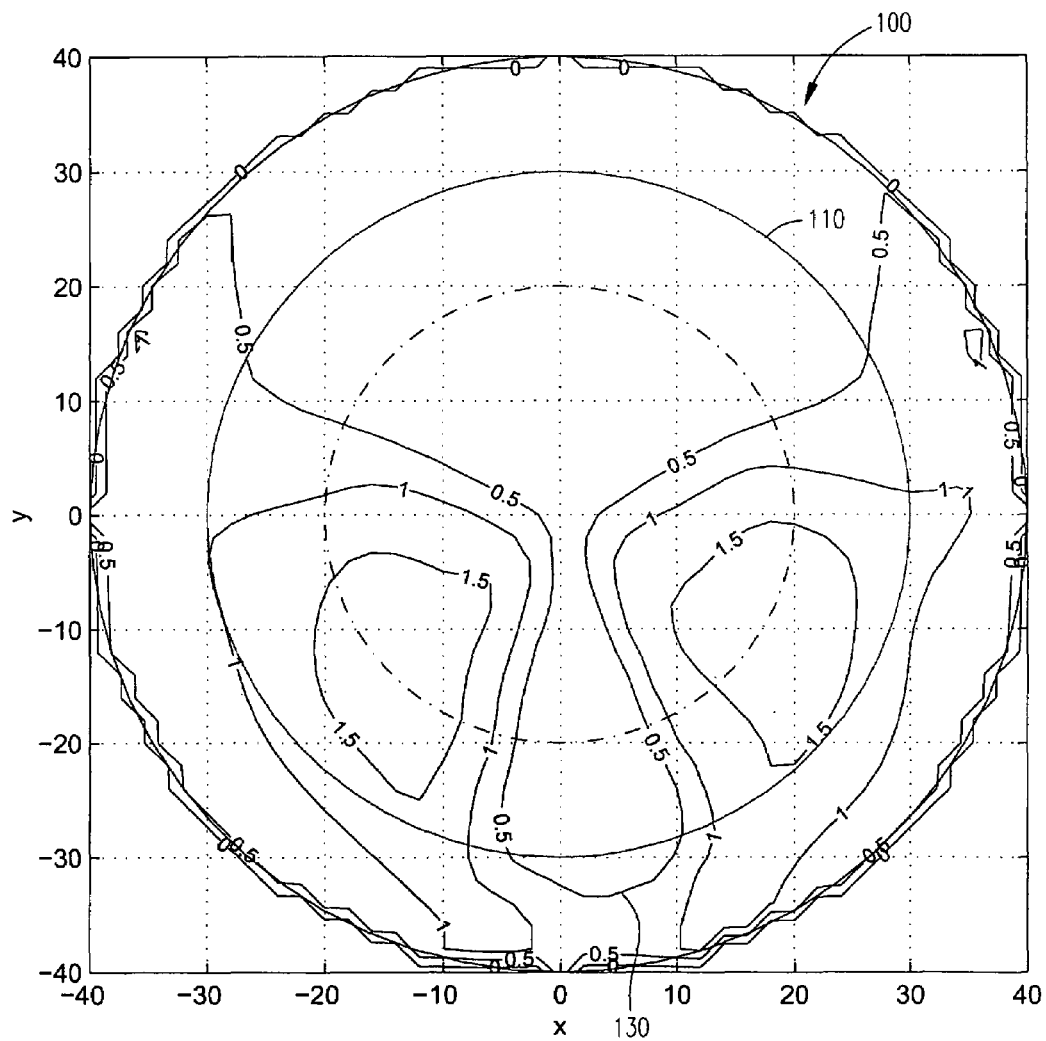

FIG. 1B includes contours 130 of constant astigmatism, sometimes called cylinder. Astigmatism is proportional to the curvature difference between the two directions at the point, $A(x,y)=|k_1(x,y)-k_2(x,y)|$. Unless astigmatism is deliberately designed in to correct an astigmatic condition, it should be lowest in the far-view, near-view, and corridor portions. Astigmatism in other portions of the lens is not as critical, although a good design attempts to reduce it throughout the lens surface.

Figure 2:
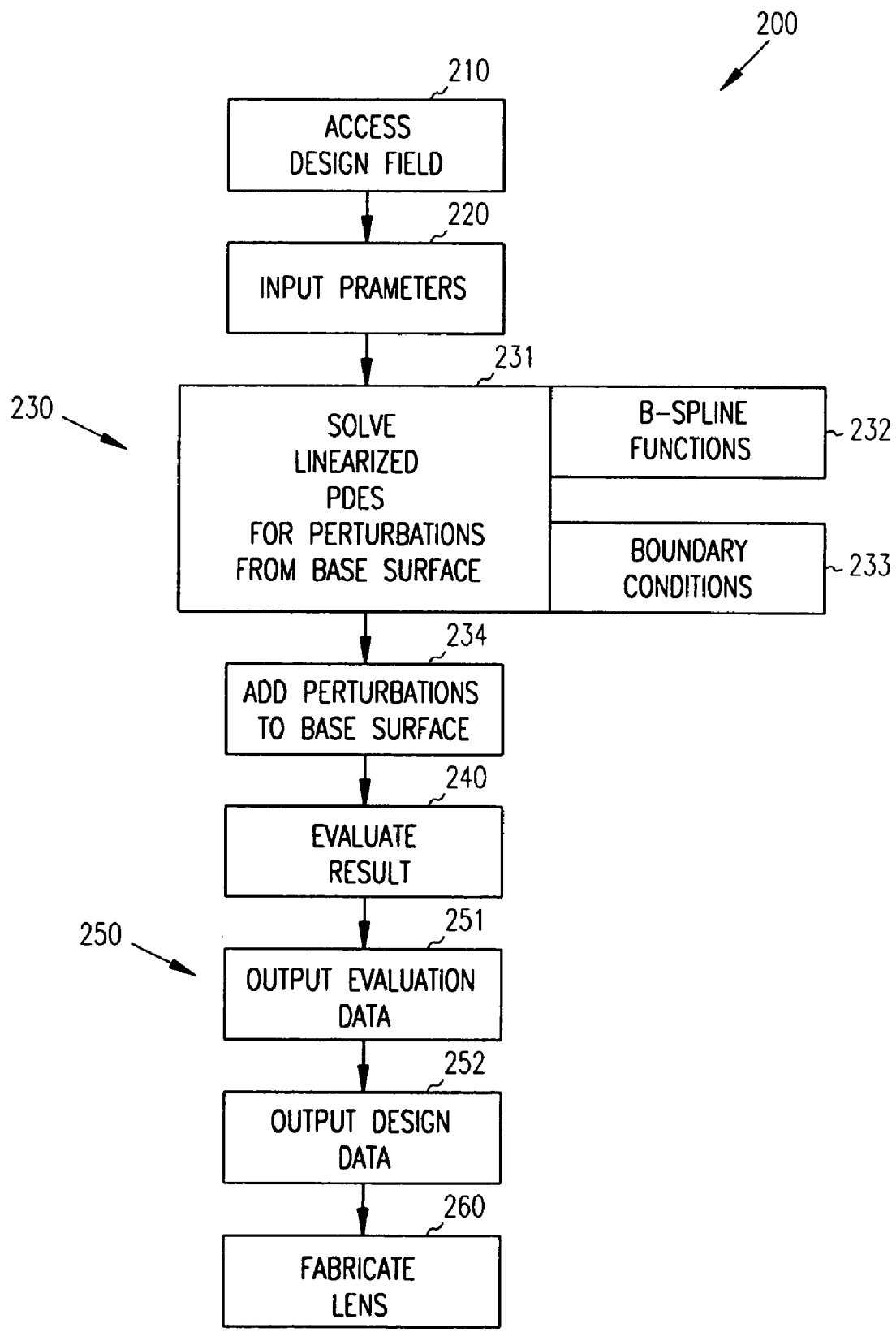
FIG. 2 is a flowchart for an example of a method for designing lenses such as that of FIG. 1.

FIG. 2 is a flowchart showing an embodiment of a method 200 for designing a multifocal optical device. In this embodiment, the device is a progressive ophthalmic lens.

Figure 3:
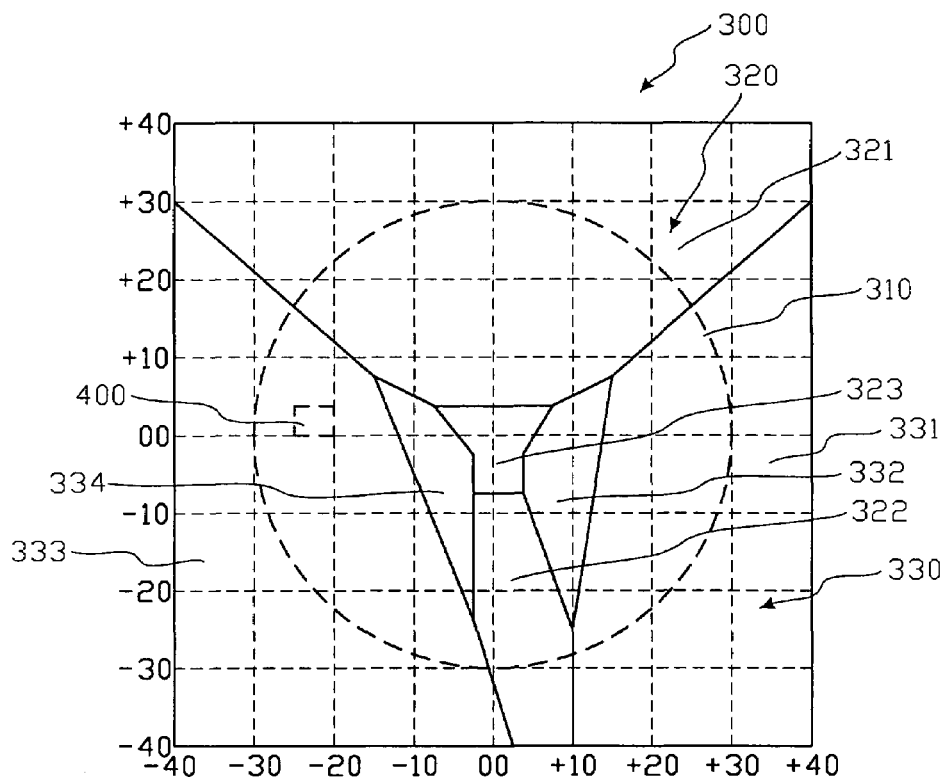
FIG. 3 shows the partition of a design field into zones.

Block 210 accesses a predefined design field. The field may be partitioned into zones for the purpose of assigning weights indicating the importance of various locations in the field. FIG. 3 shows a representative field 300 over which method 200 produces output data. Most lenses have a generally circular shape, and the field can be defined in a circular or other overall shape. However, we have found that a square field allows us to simplify solution of the equations. Dashed line 310 indicates the edge of a typical lens within the field. Output data outside this edge is simply discarded. The axes of field 300 indicate coordinates in millimeters away from the lens center. A primary region 320 defines areas of higher importance, in which the astigmatism should be low. Region 320 includes a zone 321 roughly corresponding generally to the base-power far-view area of an ophthalmic lens, a zone 322 in the area of the add-power near-view zone, and an intermediate zone 323 forming a corridor of progressively increasing power between zones 321 and 322. A secondary region 330 defines field areas of lesser importance, such as outlying zones 331–334. Region 330 at least partially surrounds region 320. More or fewer zones and differently shaped zones are also useful.

Block 220 receives a data from the designer to specify parameters for a particular design. Some of these concern properties of the lens. For example, the designer specifies the overall size of the lens and the index of refraction n of the lens material. Typical diameters are about 60 to 80 mm. For common optical glasses used in PALs, $1.5 \leq n \leq 1.7$ is a typical approximate range. An add power for near vision is specified in diopters, commonly 0.75 to 3.5 in increments of 0.25. Some parameters concern characteristics of the design, such as a base radius of the lens. For ophthalmic applications, this radius usually lies in the approximate range of 65–350 mm, smaller radii being usual for high prescriptions (e.g., base power +3), and larger radii for lower prescriptions (e.g., −10). A designer commonly selects appropriate sizes, front-surface powers and back-surface powers from standard charts for desired prescription ranges. The grid size of field 300 may be allowed to vary as an input parameter as explained below. Although there is no inherent limitation on grid spacing, smaller spacings have higher resolution, but larger ones favor computational efficiency; acceptable compromises typically make each grid square or patch approximately 1–4 mm.

Figure 1C:
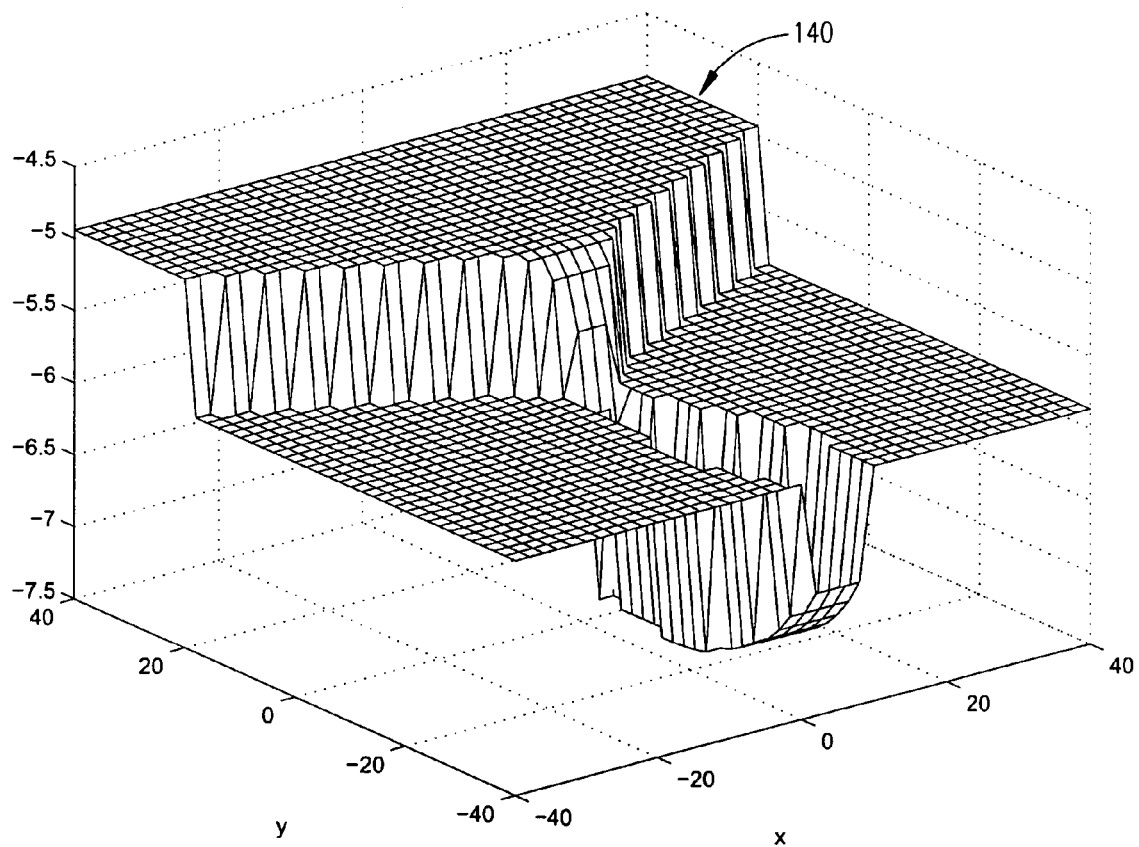

The designer selects a desired or prescribed power distribution function $P(x,y)$ over design field 300. The value of this function approaches the far-vision power in zone 321 and the near-vision power in zone 322. The designer may encode into the power function such specifications as the length and angle of the corridor between the far-vision and near-vision zones, and the point at which the power begins to change. This function may be specified in a relatively arbitrary manner over the lens surface. It is often convenient to specify it as a piecewise constant function having different values in each zone. Because of the sharp discontinuities of such a function, it may be smoothed, for example by convolution with a Gaussian function or a spline, if desired. FIG. 1C graphs a power-distribution function 140 for example lens 100.

Figure 1D:
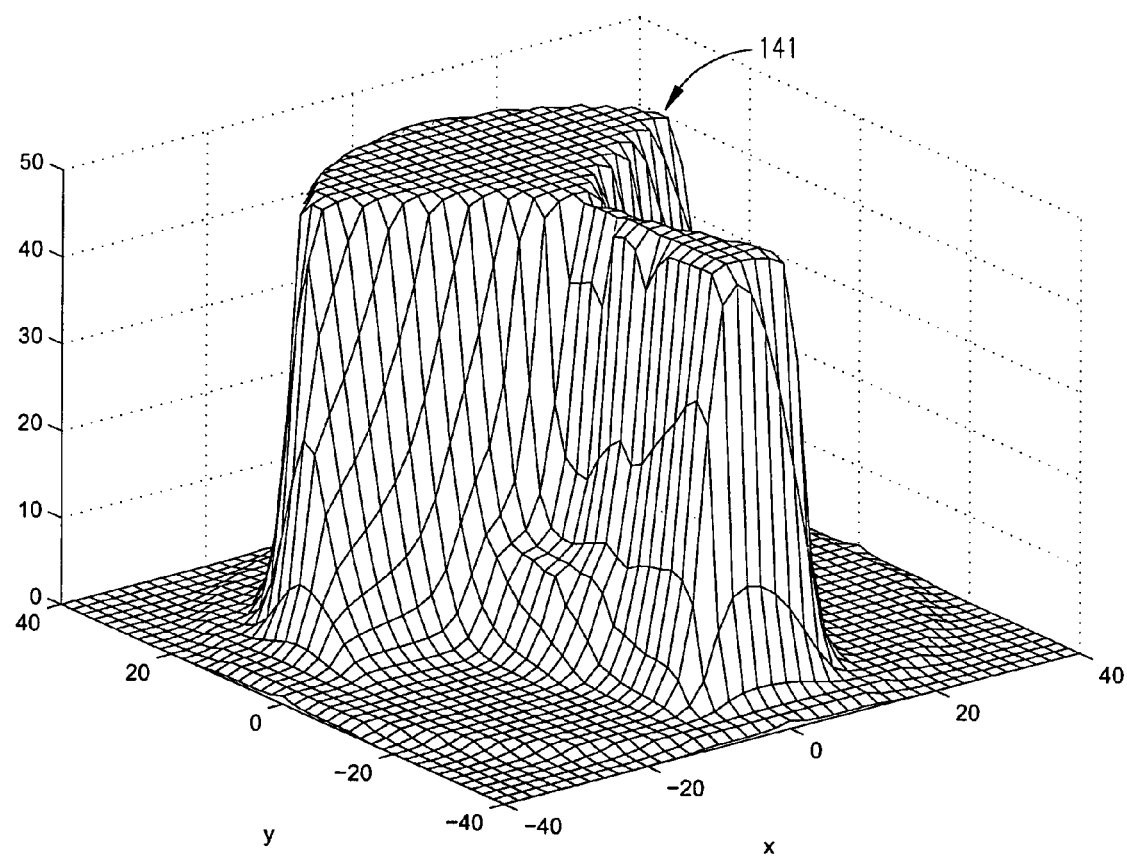
Figure 1E:
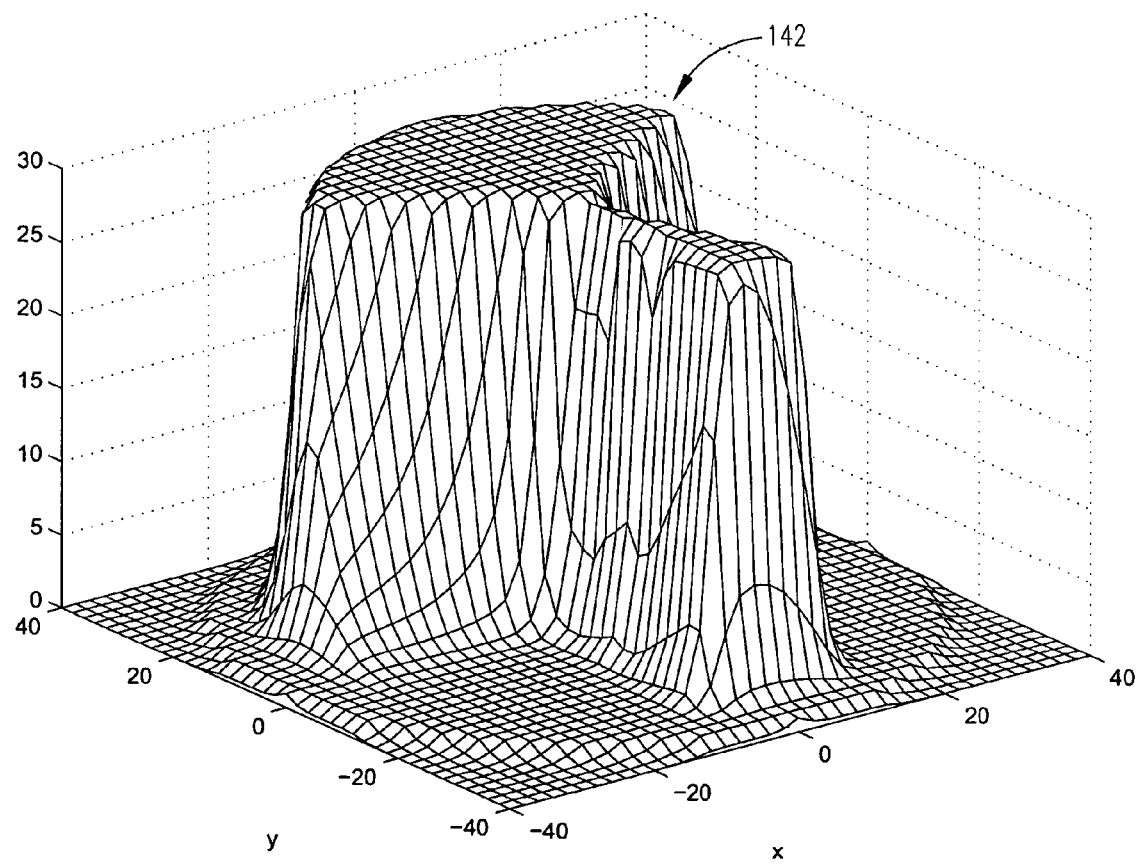

The designer also assigns two weight functions over the area of field 300. A designer selects their magnitude distributions in the x and y directions of field 300 for a particular design. The weight functions may be in any form. It is often convenient to assign them as piecewise-constant functions, with or without smoothing, conforming to the boundaries of the zones defined above. An astigmatism weight function $\alpha(x,y)$ is large where the designer wishes small astigmatism. A power-deviation weight function $\beta(x,y)$ is large where the designer wishes low deviation from the power prescribed by $P(x,y)$. In this example, both weight functions are positive-valued, in order to guarantee existence and uniqueness of the design solution. A designer typically wishes to overlap areas of low astigmatism with areas having low power deviation. Providing two independent weight functions allows freedom to assign these areas in any desired manner with respect to each other for different applications and preferences, and allows choices as to power accuracy and astigmatism to be made separately. A lens configuration depends strongly upon these two functions. The high computation speed of method 200 allows a user to pursue many variations of a design. FIGS. 1D and 1E graph sample $\alpha$ and $\beta$ weight functions 141 and 142 for lens 100.

Blocks 230 comprehend operations for generating output data representing the surface of an optical device such as progressive or multifocal lens 100. For a surface defined parametrically as $u(x,y)$, we have selected a measure of the surface quality defined as:

$$I(u) = \int \left\{ \alpha(x,y)\left(\frac{k_1-k_2}{2}\right)^2 + \beta(x,y)\left(\frac{k_1+k_2}{2} - P(x,y)\right)^2 \right\} dxdy$$

where the integral is taken over the entire design field 300 and P is the prescribed power at various points in the design field. (All integrals of unspecified range herein are understood to be taken over the entire design field 300.) An overall lens design depends significantly upon the designer's choices of the weight functions $\alpha$ and $\beta$. This gives the designer freedom to select among many options for different applications and preferences, and allows choices as to power accuracy and astigmatism to be made independently of each other.

In this context, optimizing the design means minimizing the value of the surface-quality measure, which may also be thought of as a cost function. Its global minimum specifies the height of a surface $z=u(x,y)$ within the design field 310 that has nearly correct powers and low astigmatism in the areas selected as important by the weight functions. For the present purpose, we have modified the formulation of this measure so as to express it in terms of the mean curvature H(x,y), as defined above, and the Gaussian curvature $K(x,y)=k_1(x,y) \times k_2(x,y)$. The quality measure then becomes:

$$\int \{\alpha(H(x,y)^2-K(x,y))+\beta(H(x,y)-P(x,y))^2\}dxdy$$

The explicit forms of H and K, in terms of u(x,y), then become:

$$H(u) = \frac{(1+u_x^2)u_{yy} - 2u_x u_y u_{xy} + (1+u_y^2)u_{xx}}{2(1+u_{0x}^2+u_{0y}^2)^{3/2}}$$

$$K(u) = \frac{u_{xx}u_{yy} - u_{xy}^2}{(1+u_x^2+u_y^2)^2}$$

where the subscript notation signifies partial differentiation with respect to the subscripted variable. From the variational calculus, the necessary condition for a minimum in I(u) is:

$$\left.\frac{d}{dt}\right|_{t=0} I(u+t\delta) = 0$$

for all infinitely differentiable functions $\delta(x,y)$ having compact support. This condition translates to the following form:

$$\int \{2((\alpha+\beta)H-\beta P)(H_{u_x}\delta_x + H_{u_y}\delta_y + H_{u_{xx}}\delta_{xx} + H_{u_{xy}}\delta_{xy} + H_{u_{yy}}\delta_{yy}) - \alpha(K_{u_x}\delta_x + K_{u_y}\delta_y + K_{u_{xx}}\delta_{xx} + K_{u_{xy}}\delta_{xy} + K_{u_{yy}}\delta_{yy})\}dxdy = 0$$

If α, β, and P are at least twice differentiable, then integration by parts twice yields the fourth-order partial differential equation:

$$(\alpha K_{u_x})_x + (\alpha K_{u_y})_y - (\alpha K_{u_{xx}})_{xx} -$$
$$(\alpha K_{u_{xy}})_{xy} - (\alpha K_{u_{yy}})_{yy} - 2((\alpha H + \beta H - \beta P)H_{u_x})_x -$$
$$2((\alpha H + \beta H - \beta P)H_{u_y})_y + 2((\alpha H + \beta H - \beta P)H_{u_{xx}})_{xx} +$$
$$2((\alpha H + \beta H - \beta P)H_{u_{xy}})_{xy} + 2((\alpha H + \beta H - \beta P)H_{u_{yy}})_{yy} = 0$$

This is a form of the Euler-Lagrange equation corresponding to this variational problem. This Euler-Lagrange form is nonlinear, requiring excessive amounts of computational power and time for solution. A finite-element solution of acceptable spatial resolution might require several hours on the types of computers now economically feasible for use in this type of application. However, we have constructed a simplification that greatly reduces the computational load while retaining accuracy and resolution. The surfaces for most ophthalmic prescriptions, and for many other kinds of practical lenses, are almost spherical. We therefore treat the surface u(x,y) as a perturbation v(x,y) from a specified spherical surface $u_0(x,y)=\sqrt{(R^2-x^2-y^2)}$ of radius R, and we treat the gradients $v_x$ and $v_y$ of the perturbation as small. (Although the equation could alternatively be linearized about a plane or other fixed surface, this embodiment employs spherical linearization as preferable for many ophthalmic applications.) These modifications have the effect of linearizing the Euler-Lagrange equation, which allows us to express H and K as:

$$H_u(u) = \frac{1}{R} + \frac{(1+u_{0x}^2)v_{yy} - 2u_{0x}u_{0y}v_{xy} + (1+u_{0y}^2)v_{xx}}{2(1+u_{0x}^2+u_{0y}^2)^{3/2}} + E_1$$

$$K(u) = \frac{(u_{0xx}+v_{xx})(u_{0yy}+v_{yy}) - (u_{0xy}+v_{xy})^2}{(1+u_{0x}^2+u_{0y}^2)^2} + E_2$$

where $E_1$ and $E_2$ are small error terms. We select a domain where $x^2+y^2<R^2$, where R is the radius of the spherical surface $u_0$. This radius may be taken as the base radius specified above as a parameter. Then, if $|v_x,v_y|<<1$ and if $|v_{xx},v_{xy},v_{yy}|$ is bounded from above, $E_1$ and $E_2$ become insignificant.

We then recast the variational problem with these simplified forms, using a constant spherical surface of radius R that is selected by the designer or chosen in some other way. The above necessary condition for a minimum of I(u) then becomes:

$$\int [2(\alpha+\beta)H_{u_0}(v)H_{u_0}(\delta) - \alpha K_{u0}(\delta,v)]dxdy -$$
$$\int \left[2\beta\left(P - \frac{1}{R}\right)H_{u_0}(\delta)\right]dxdy = 0$$

The terms $H_{uo}$ and $K_{uo}$, which no longer represent true curvatures, are defined as:

$$H_{u_0}(v) = \frac{(1+u_{0x}^2)v_{yy} - 2u_{0x}u_{0y}v_{xy} + (1+u_{0y}^2)v_{xx}}{2(1+u_{0x}^2+u_{0y}^2)^{3/2}}$$

$$K_{u_0}(\delta,v) = \frac{\delta_{xx}v_{yy} + \delta_{yy}v_{xx} - 2\delta_{xy}v_{xy}}{(1+u_{0x}^2+u_{0y}^2)^2}$$

Here again, $\delta(x,y)$ is an arbitrary test function expressing the variation. This formulation demonstrates that $H_{u0}$ is linear, and $K_{u0}$ is bilinear and symmetric. We then defined two functions $B(\delta,v)$ and $L(\delta)$ as:

$$B(\delta,v) = \int [2(\alpha+\beta)H_{u_0}(\delta)H_{u_0}(v) - \alpha K_{u_0}(\delta,v)]dxdy$$

$$L(\delta) = \int \left[\alpha K_{u_0}(\delta,u_0) + 2\left(\beta P - \frac{\alpha+\beta}{R}\right)H_{u_0}(\delta)\right]dxdy$$

where B is a bilinear form depending on δ and the perturbation function v, and where L is a linear functional of δ alone. We then pose the minimum cost as a variational form $B(\delta,v)=L(\delta)$, for all δ in the relevant subspace of functions having the desired properties.

Block 231 of method 200 solves the linearized partial differential equation $B(\delta,v)=L(\delta)$ as a boundary-value problem for the parameters input in block 220. The solution v(x,y) represents the perturbation or difference in height from the specified spherical surface $u_0(x,y)$ over the entire design field 300.

Figure 4:
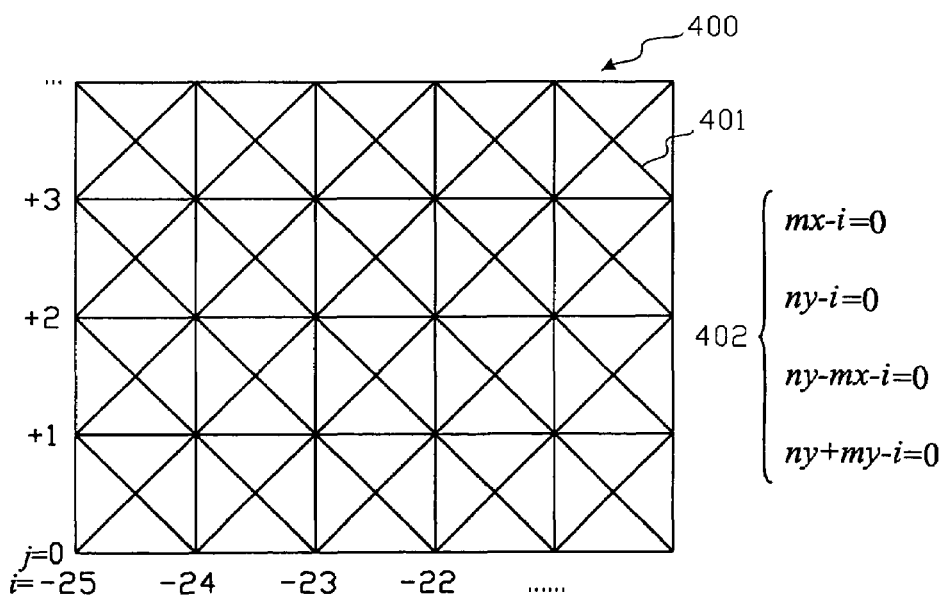
FIG. 4 illustrates a grid for finite element analysis.

A number of general finite elements are known for solving the present type of fourth-order equations on a digital computer, such as the Argyris element and the Hsieh-Clough-Tocher (HCT) element. However, these are computationally intensive. The Argyris triangle, for example, employs polynomials of degree five. Although the HCT element uses only cubic polynomials, each triangle must be divided up into three smaller triangles, each computed individually. As noted above, design field 300 is preferably square, even though the shape of most lenses is generally round. Defining the field in this shape rather than the usual round shape permits the use of a more efficient element. FIG. 4 shows a representative portion 400 of design field 300 divided by a grid of horizontal, vertical, and diagonal lines 401. (Dashed line 400 in FIG. 3 indicates the approximate relative size and location of portion 400 with respect to field 300; for clarity of exposition, the vertical lines i and the horizontal lines j are here taken to form squares 402 that are 1 mm on a side, although normally they are somewhat larger. The entire field 300 is divided into elements in a similar manner. Equations 410 define these lines on the field, assuming a center origin and normalization to unit length. For a typical 80 mm diameter ophthalmic lens, a typical grid element size (i.e., spacing between adjacent horizontal or vertical lines 401) may be in the range of about 1–4 mm. A field 300 triangulated in this manner may be described as having a uniform triangulation of type II.

Block 232 introduces a set of basis functions for solving the linearized partial differential equation. A triangulation of type II permits the basis functions to comprise a particular type of spline function having compact support and including piecewise quadratic polynomials which are continuously differentiable. Employing quadratic polynomials, rather than those of higher degree, considerably eases the computational burden over previous approaches.

FIG. 5A graphs a representative B-spline function 500 which is piecewise quadratic over the octagon 510 in FIG. 5B. The numerals at the vertices in FIG. 5A show the normalized coordinates relative to the center [0,0]. This example quadratic B-spline is defined over the coordinate range in FIG. 5B as:

$$B(x,y) = B^0(x,y) + B^x(x,y) + B^y(x,y) + B^{xy}(x,y) + B^{yx}(x,y)$$

The spline is defined as identically zero outside octagon 510, giving it a compact support. The constituent terms of the spline are defined as:

$$B^0(x, y) = \frac{1}{2} - \frac{1}{2}x^2 - \frac{1}{2}y^2$$

$$B^x(x, y) = \begin{cases} \frac{1}{2}\left(x + \frac{1}{2}\right)^2, & -\frac{3}{2} \le x \le -\frac{1}{2} \\ 0, & -\frac{1}{2} \le x \le +\frac{1}{2} \\ \frac{1}{2}\left(x - \frac{1}{2}\right)^2, & +\frac{1}{2} \le x \le +\frac{3}{2} \end{cases}$$

$$B^y(x, y) = \begin{cases} \frac{1}{2}\left(y + \frac{1}{2}\right)^2, & -\frac{3}{2} \le y \le -\frac{1}{2} \\ 0, & -\frac{1}{2} \le y \le +\frac{1}{2} \\ \frac{1}{2}\left(y - \frac{1}{2}\right)^2, & +\frac{1}{2} \le y \le +\frac{3}{2} \end{cases}$$

-continued $$B^{xy}(x, y) = \begin{cases} \frac{1}{4}(x+y+1)^2, & -2 \le x+y \le -1 \\ 0, & -1 \le x+y \le +1 \\ \frac{1}{4}(x+y-1)^2, & +1 \le x+y \le +2 \end{cases}$$

$$B^{yx}(x, y) = \begin{cases} \frac{1}{4}(y-x+1)^2, & -2 \le y-x \le -1 \\ 0, & -1 \le y-x \le +1 \\ \frac{1}{4}(y-x-1)^2, & +1 \le y-x \le +2 \end{cases}$$

This example of a piecewise quadratic spline function is described in P. B. Zwart, "Multivariate Splines with Non-degenerate Partitions," *SIAM J. Numer. Anal.* 10 (1973), pp.665–673. (B-spline function B(x,y) has no relation to bilinear function B(δ,v). The difference will be apparent from the context.)

The generic spline B(x,y) is copied once for every square 402, FIG. 4, over the entire field 300 of FIG. 3, and for one layer outside field 300 on all four sides, to form an extended field. If the grid on field 300 is normalized to a unit square [0,1]×[0,1] and has m rows and n columns, the spline copies are denoted as:

$$B_{ij}(x, y) = B\left(mx - i + \frac{1}{2}, ny - j + \frac{1}{2}\right)$$

for i=0, . . . , m+1 and j=0, . . . , n+1. The center of the ij-th spline lies at the point [(i–½)/m, (j–½)/n]. The spline coordinates may then be scaled to fit the grid selected for a particular design.

The square elements 511 of support 510 are the same size as square elements 402 of field 300. The central square 512 of spline 500 is placed over each square 402 of the extended field 300. That is, the outer rows and columns of the support extend one grid spacing beyond the edge of design field 300 in every direction. Using the splines as basis functions realizes the solution to the variational equation as a linear superposition of a number of these overlapping splines. That is, a computer solves the equation B(δ,v)=L(δ) as a set of simultaneous equations. First, we set v(x,y)=Σc$_{ij}$B$_{ij}$(x,y) over all ij. Substituting this into B(δ,v)=L(δ) yields a system of linear simultaneous equations with the c$_{ij}$ as unknowns. Solving this linear system gives the values of the c$_{ij}$, which are then inserted back into Σc$_{ij}$B$_{ij}$(x,y) to find the values of v(x,y) for all values of xy.

Block 233 imposes the boundary conditions on the linearized equation B(δ, v)=L(δ). We consider three types of boundaries: clamped, partially clamped, and natural (or free) boundary conditions; free and partially clamped conditions may also be grouped together as less than fully clamped conditions. A clamped boundary specifies that u=0 and (u$_x$,u$_y$)=0 over the entire boundary. A partially clamped boundary specifies u=0 and (u$_x$,u$_y$)=0 for a designated part of the boundary. A free boundary allows u, u$_x$, and u$_y$ to have any values on the boundary. Our methods permit a unique solution for all three types of boundaries, as long as a≧a$_0$≧0 and β≧0. The desired boundary conditions are imposed by selecting only certain of the simultaneous equations and/or by setting certain variables to desired values. For many ophthalmic applications, we have found that natural (free) boundary conditions produce very good results.

In this case, using all of the splines overdetermines the solution, so a solution might not exist. Dropping the splines in the four corners of design field 300 offers a convenient way to achieve a unique solution for natural boundary conditions. This is equivalent to specifying the value of v(x,y) at each corner of field 300.

Should partially clamped conditions be desired for other applications, a designer may, for example, set v(x,1)=0 to clamp the upper edge of design field 300 to the far-vision spherical surface. (y=1 here indicates the upper edge of a design field normalized to a unit square.) In that case, the top row of splines is discarded; that is, those splines whose support exist only within the top surface participate in the solution. Fully clamped boundaries may be imposed in a similar manner. We believe, however, that a fully clamped boundary produces less desirable designs for many ophthalmic purposes.

Finally, block 234 adds the variations v(x,y) to the base-radius spherical surface $u_0(x,y)$ to produce a set of heights $u=u_0+v$ above a plane at every point within design field 300. (These heights may be easily converted to any other form desired for device fabrication or other purposes.) Because the splines exist throughout the design field, and not only at the grid points of the triangulation, a computer may calculate and output them for any set of points desired by a grinder, plastic casting apparatus, or other tool that actually fabricates a lens. The data may be truncated or discarded outside the edge 100, FIGS. 1 and 3, of the desired lens diameter.

Block 240 evaluates the design produced in block 230. An example of such an evaluation is to display or print images such as 100 and 110, FIGS. 1A and 1B for an operator to inspect. The spline functions employed in the described embodiment of block 230 are quadratic, in order to reduce the amount of computation. However, such splines and their superpositions do not have well-defined second derivatives at the grid points. Therefore, it is not in general possible to calculate the lens power or astigmatism at some points, because the curvature cannot be determined there. Block 240 may then interpolate between the grid points with a set of higher-degree tensor-product splines. Fifth-degree tensor-product splines, for example, have well-defined second derivatives at all points, and can match the second derivatives of adjacent splines at their ends, so that curvature and astigmatism is well-defined at every point in design field 300. The evaluation data are thus calculated from the higher-degree splines. Using splines of degree higher than the quadratic splines of block 232 for evaluation does not significantly increase overall computation time; the computational effort for evaluation is generally much less than for the design. Other evaluation methods, manual or automatic, are also possible.

Blocks 250 output previously calculated data. Block 241 may present the evaluation data from block 240 on a display or printer for inspection by the designer. Block 242 outputs the design data in a desired format. This format may comprise a data set for direct fabrication of a lens according to the design. Outputting the evaluation and design data may involve storing or communicating the data, or manipulating it in other ways. For many applications, method 200 is may operate on a one-pass basis, where the evaluation data is primarily employed for comparison with other designs. However, if desired, method 200 can easily be configured to repeat blocks 220–252 for successive iterations of the same design, with or without new parameters from the designer. If desired, the computer itself may analyze the evaluation data, and specify new design parameters for further iterations.

Block 260 represents manufacturing a physical lens from the data output by block 252. This operation may employ any fabrication technique, such as numerically controlled grinding and polishing of glass blanks or molding of cast plastic.

FIG. 6 illustrates an example of a computerized system 700 for hosting the invention. Bus 710 connects a number of components, such as a processor 720, internal storage 730, and input/output devices 740. Blocks 740 may include input devices 741 such as keyboard and mouse, and output devices 742 such as a display and printer. Storage 750 may accept an external medium such as 751 for holding instructions and data for carrying out methods according to the invention, for holding data for designs of the optical devices produced by the invention, and/or for other data, such as input parameters. One or more interfaces 760 communicate between components 710–750 and external computing facilities, such as server 770 and lens fabricating machinery 780. Server 770 may constitute a remote facility for holding design programs and data, and/or other items pertaining to system 700. Block 780 may comprise a numerically controlled (NC) grinding engine of any type, molding apparatus for cast plastic lenses, or any similar apparatus. It may accept design data from system 100, by communication over a network 761 or from removable medium 751, to produce PAL lenses or other optical devices 782 from blanks 781. In some cases, it may be advantageous to combine machinery 780 physically with some or all of the components 710–750, receiving data directly rather than communicating over an external network 761. Machinery 780 may also supply data back to other components for design verification or other purposes.

Astigmatism Correction

The basic design methods described above attempt to reduce all astigmatism in the lens to zero. However, many ophthalmic lenses include a prescribed amount of astigmatism or cylinder in order to correct a measured amount of astigmatism in a patient's eyes. Single-power lenses commonly employ a spherical (or aspherical) surface, and a toric or atoric surface to give both power and astigmatism correction in the same surface of the lens.

In conventional designs, the complex surfaces of progressive lenses preclude astigmatism correction in the same surface as power correction. Progressive lens designs, including those using the basic methods above, grind or mold the progressive magnifying powers into one surface of a lens (usually the front), and fabricate the prescribed astigmatism or cylinder correction with toric curves in the other surface, because the power of a thin lens is always the difference in powers between the two surfaces. Disadvantages of this technique include added time and expense in fabricating both lens surfaces, and optical errors arising from the distance between the two surfaces. Further, researchers in recent years have found that placing progressive power correction on the back surface of a lens offers advantages such as increasing the area of clear vision; placing prescribed astigmatism on the back surface denies this feature to patients who require astigmatism correction.

An extension to the basic methods of the present invention, however, permit a prescribed amount of astigmatism correction to be designed and fabricated into the same surface as the progressive power correction. The basic methods design progressive powers as perturbations from a base surface such as a sphere, or even a plane. However, the equation forms chosen for the basic methods do not significantly limit the shape of the base surface. Therefore, the extended methods place a prescribed astigmatism correction into the base surface, and design the progressive power correction as a perturbation to that surface. The base surface may constitute a surface that also incorporates part or all of the far-view correction for the progressive prescription. Although the following examples employ toric base surfaces, atoric surfaces are also suitable.

A torus is a volume of revolution, part of whose surface can be expressed as:

$$z(x, y) = \sqrt{\left(R + \sqrt{R_1^2 - x^2}\right)^2 - y^2}$$

In this example, the astigmatism correction is horizontal (angle $\pi/2$) if $R>R_1$. Rotating the surface produces corrections at any other prescribed angle.

Following the same approach as in the basic methods, we assume that the final surface is a base surface with a perturbation, $u(x,y)=u_0(x,y)+v(x,y)$. In this case, however, the base surface is a toric surface that includes at least the astigmatism correction, and may include some power correction as well. That is, $u_0=z$ on a rotation of z.

The expressions for H(u) and K(u) in the previous section could have assumed several different forms; the particular forms were selected in order to facilitate the present purpose as well. Here again, the error terms $E_1$ and $E_2$ are insignificant as long as $a^2+y^2 \leq cR^2$, where c<1. The expressions then become:

$$H \approx H_{u_0}(u_0)+H_{u_0}(v)$$

$$K(u) \approx K_{u_0}(u_0)+K_{u_0}(v)+K_{u_0}(u_0,v)$$

where:

$$K_{u_0}(w) = \frac{1}{2} K_{u_0}(w, w),$$

w being a dummy variable. We now represent the cylinder—i.e., the measure of its astigmatism—as $A(u)=A(u_0)+A_{u_0}(v)$, where the first term represents the cylinder of the original surface $u_0$ and the second term is the change in cylinder resulting from a perturbation.

In contrast to the basic methods described in the previous section, we desire to keep the prescribed amount of cylinder of the original surface, at least in the critical regions 321–323, FIG. 3, for far, near, and intermediate vision. Therefore, the goal is to minimize $A_{u_0}(v)^2$ instead of $A(u)^2$. Clearly, $A(u_0)^2=H_{u_0(u_0)}^2-K_{u_0}(u_0)$, and approximately $A_{u_0}(v)^2 \approx H_{u_0}(v)^2-K_{u_0}(v)$. We then define the following functional, integrating as usual over the entire design domain 300, FIG. 3:

$$I(u)=\int [\alpha(x,y)(H_{u_0}(v)^2-K_{u_0}(v))+\beta(x,y)(H(u)-P(x,y))^2] \, dxdy$$

Assume that the surface u(x,y) minimizes the functional. As before, let the test function $\delta(x,y)$ be infinitely differentiable over the continuum. Calculating the first variation of I(u) at u and using the notations $H_{u_0}(v)$ and $K_{u_0}(\delta,v)$ as in the previous section yields:

$$\int [2(\alpha+\beta)H_{u_0}(v)H_{u_0}(\delta) - \alpha K_{u_0}(\delta, v)]dxdy =$$

$$\int 2\beta(P - H_{u_0}(u_0))H_{u_0}(\delta)dxdy$$

This result yields bilinear and linear terms that are similar to those in the equations for B($\delta$,v) and L($\delta$) in the preceding section, the only difference residing in the second line. A spherical surface is a special case of a toric surface, and it can indeed be shown that these two equations match when $u_0$ is a spherical surface of radius R.

Method 200, FIG. 2, can now be adapted to design progressive lenses with astigmatism correction on the same surface.

Block 220 adds another input parameter, a conventional specification of a prescribed astigmatism power (cylinder) and axis angle. From this, method 200 may easily calculate an appropriate toric base surface $u_0(x,y)$.

Block 231 solves an equation B'($\delta$,v)=L'($\delta$) in the form written directly above, rather than in the form described in the previous section. This equation is already linearized, therefore greatly reducing the computing time and power required for its solution. The solution still minimizes the astigmatism toward zero, using the weight function $\alpha$, because this solution includes only the undesired astigmatism from the progressive powers, and does not carry any part of the prescribed correctional astigmatism. The splines 232 of FIG. 5 or others may serve as basis functions as in the previous section. Boundary conditions 233 are employed in the same way.

Operation 234 adds the perturbations from the toric base surface $u_0(x,y)$ defined in modified block 220 to produce a set of heights $u=u_0+v$ above a plane at every point within design field 300. Again, these heights may be converted to other units and formats if desired.

The output design data 252 now represents a single surface incorporating both progressive power corrections and astigmatism corrections. Block 260 thus need only fabricate a single lens surface for both corrections.

FIG. 6 shows an example ophthalmic progressive addition lens (PAL) 600 that incorporates both multiple magnifying powers and prescribed astigmatism in a single surface according to the invention. This lens, having an edge 610, typifies designs made with our procedure, although other optical devices can be produced in a similar manner. The coordinate axes denote millimeters from the center of the lens. FIG. 6A includes contour lines 620 having constant optical power. FIG. 6B includes contours 630 of constant astigmatism or cylinder. Short bars 640 indicate the direction of maximum principal curvature, that is, the direction of the total astigmatism, both for the prescribed correction and for errors induced by the progressive powers.

This example illustrates a lens design of radius 30 mm, having an add power of 2.0 diopters, and a prescribed (i.e., desired) astigmatism correction of 3.0 diopters at an angle of $\pi/4$.(northwest in FIGS. 6A and B). This design achieves the add power, and the total astigmatism is close to the prescribed value in the far-vision, near-vision, and corridor regions. The direction of the total astigmatism remains close to the prescribed direction, and both the power and the cylinder vary smoothly, without visibly annoying sharp changes. There is a clear corridor connecting the far and near regions in the cylinder contour in FIG. 6B. The maximum deviation in total astigmatism from the prescribed value is only 75% of the add power, that is, 75% of the difference between the magnifying powers of the far- and near-vision regions. This is a remarkable result in comparison to previous progressive designs known to us. Typically, a design is considered good when its total astigmatism deviates from the prescribed value by less than 100% of the add power over the lens surface.

System and Products

FIG. 7 illustrates an example of a system 700 for hosting embodiments of the invention. A bus 710 interconnects a digital processor 720, internal storage such as RAM and/or ROM 730, and input/output equipment 740, including display and/or printer devices 741 and keyboard and/or pointing devices 742. I/O equipment 740 may receive input parameters for methods according to the invention, and display prompts, evaluations, and other data for the methods. Bus 710 also couples external storage devices 750 such as magnetic and/or optical drives capable of reading and/or writing removable media such as disk 751. One or more interfaces 760 mediate data transfer among bus 710 and other equipment such as remote server 770 and/or fabrication machinery such as lens grinder 780. One or more links 661 may be realized as direct wire or wireless connections, local or wide-area networks, or public networks such as the Internet.

Instructions and data for practicing methods according to the invention may be held and/or transferred by various media, such as external storage 651, communication links 661, and storage 771 associated with a remote server.

Numeral 790 illustrates an optical product according to the invention, in this example ophthalmic spectacles or eyewear. Machinery 680 accepts lens blanks 791 or other raw materials, fabricating therefrom finished progressive lenses 792, possibly with prescribed astigmatism correction. Fabricating lenses 792 may include cutting them to a shape different from that of blanks 791. Lenses 792 each have a front surface 793 away from the wearer, and a back surface 794 toward the wearer.

If astigmatism correction is included, the basic methods described above may place the multiple magnifying powers on one surface such as front surface 793, and the prescribed astigmatism on a cylindrical, toric, or atoric back surface 794. Extended methods such as those described in the Astigmatism Correction section are capable of grinding, molding, or otherwise fabricating both the progressive magnifying powers and the prescribed astigmatism correction directly in a single surface of blanks or materials 791, in a single operation.

Some researchers believe that placing the progressive powers on back surface 794 has advantages, such as a larger clear-vision area. Methods according the present invention permit this where astigmatism correction is also included, by integrating both the magnifying-power corrections and the astigmatism correction into the same surface. Placing both on the same surface also eliminates undesirable offsets between the two forms of correction when they are placed on physically separated surfaces.

Where astigmatism correction is not included, or where it is included on the same surface as the magnifying corrections, the other surface of lenses 792 may have a constant power, such as a spherical surface. The two lenses may of course differ from each other in magnifying and/or astigmatism corrections, as a particular wearer may require different corrections in each eye.

Spectacles 790 also include any type of frame 795, attached to lenses 792 by conventional means such as fasteners or rims (not shown).

CONCLUSION

The foregoing description and the drawings illustrate specific embodiments of the invention sufficiently to enable those skilled in the art to practice the invention in those embodiments and in other embodiments. Such other embodiments may incorporate structural, logical, electrical, process, and other changes. Examples described herein merely typify possible variations. Individual components and functions are optional unless explicitly required, and operations may be performed in any order, including in parallel. Portions and features of some embodiments may be included in or substituted for those of others. The scope of the invention encompasses the full ambit of the claims set forth below, and all available equivalents.

We claim:

1. A machine-implemented method for a progressive optical device, comprising:
defining a triangulation grid over a design field;
receiving a set of parameters, including a desired power distribution function, a power deviation weight function, and an astigmatism weight function, the functions being defined over the design field;
defining a base surface over the design field;
solving a linearized variational partial differential equation on the triangulation grid in terms of the power distribution function, the power deviation weight function, and the astigmatism weight function, to produce perturbations from the base surface; combining the perturbations with the base surface to produce output data representing a surface of the optical element.

2. The method of claim 1 where the optical element is a progressive ophthalmic lens.

3. The method of claim 1 further comprising outputting the output data to a medium.

4. The method of claim 3 where the medium is a digital storage medium.

5. The method of claim 3 further comprising fabricating the optical device from the output data.

6. The method of claim 5 where fabricating the medium comprises grinding a lens blank.

7. The method of claim 1 where the power deviation weight function represents relative importances of the power distribution function over different areas of the design field.

8. The method of claim 7 where the power deviation weight function is approximately piecewise linear.

9. The method of claim 8 where the power deviation weight function is smoothed.

10. The method of claim 1 where the astigmatism weight function represents relative importances of astigmatism over different areas of the design field.

11. The method of claim 10 where the astigmatism weight function is approximately piecewise linear.

12. The method of claim 11 where the astigmatism weight function is smoothed.

13. The method of claim 1 further comprising dividing the design field into a plurality of regions.

14. The method of claim 13 where the power distribution function is approximately constant over at least some of the regions.

15. The method of claim 13 where the power deviation weight function is approximately constant over at least some of the regions.

16. The method of claim 13 where the astigmatism weight function is approximately constant over at least some of the regions.

17. The method of claim 13 where the regions include at least a far-view region, a near-view region, and a corridor region.

18. The method of claim 1 where the base surface is non-planar.

19. The method of claim 18 where the base surface is spherical.

20. The method of claim 18 where the base surface is tone.

21. The method of claim 1 where the equation includes a linear term and a bilinear term.

22. The method of claim 21 where the equation has the form $B(\delta v)=L(\delta)$, where L is a linear functional of a test function $\delta$, and B is a bilinear form depending on $\delta$ and on a perturbation function v.

23. The method of claim 22 where B and L have substantially the forms $$B(\delta, v) = \int [2(\alpha + \beta)H_{u_0}(\delta)H_{u_0}(v) - \alpha K_{u_0}(\delta, v)]dxdy$$

$$L(\delta) = \int \left[\alpha K_{u_0}(\delta, u_0) + 2\left(\beta P - \frac{\alpha+\beta}{R}\right)H_{u_0}(\delta)\right]dxdy.$$

24. The method of claim 1 where the equation is solved as superpositions of a set of overlapping splines.

25. The method of claim 23 where the splines are quadratic.

26. The method of claim 23 where each spline has compact support over a different subset of the grid elements.

27. The method of claim 23 where some of the splines have a support partially outside the design field.

28. The method of claim 1 where the boundary conditions of the equation are less than fully clamped.

29. The method of claim 28 where the boundary conditions are free.

30. The method of claim 1 where the triangulation grid is a uniform type II grid.

31. The method of claim 1 where a size of the grid is one of the received parameters.

32. The method of claim 1 further comprising evaluating the output data.

33. The method of claim 32 where evaluating includes interpolating the output data with a set of splines having at least second-order derivatives at points corresponding to points of the grid.

34. A machine-readable medium bearing instructions for causing a digital computer to execute the method of claim 1.

35. A machine-implemented method for a progressive optical device having integrated astigmatism correction, comprising:

defining a triangulation grid over a design field;

receiving a set of parameters, including a desired astigmatism correction, a desired power distribution function, a power deviation weight function, and an undesired-astigmatism weight function, the functions being defined over the design field;

defining over the design field a base surface that includes the desired astigmatism correction;

solving a variational equation on the triangulation grid in terms of the power distribution function, the power deviation function, the power deviation weight function, and the undesired-astigmatism weight function, to produce perturbations from the base surface;

combining the perturbations with the base surface to produce output data representing a surface of the optical element.

36. The method of claim 35 where the optical element is a progressive ophthalmic lens with power correction and astigmatism correction in a single surface.

37. The method of claim 36 where the single surface is a back surface.

38. The method of claim 35 further comprising outputting the output data to a medium.

39. The method of claim 38 where the medium is a digital storage medium.

40. The method of claim 38 further comprising fabricating the optical device in a lens blank from the output data by altering only a single surface.

41. The method of claim 38 where fabricating the medium comprises grinding only a single surface of a lens blank.

42. The method of claim 35 where the power deviation function represents relative importances of the power distribution function over different areas of the design field.

43. The method of claim 35 where the astigmatism weight function represents relative importances of undesired astigmatism over different areas of the design field.

44. The method of claim 35 where the base surface is toric.

45. The method of claim 35 where the equation includes a linear term and a bilinear term.

46. The method of claim 45 where the equation has the form $B'(\delta v)=L'(\delta)$, where L' is a linear functional of a test function $\delta$ and B' is a bilinear form depending on $\delta$ and on a perturbation function v.

47. The method of claim 45 where B' and L' have substantially the forms $$B'(\delta,v)=\int [2(\alpha+\beta)H_{u_0}(v)H_{u_0}(\delta)-\alpha K_{u_0}(\delta,v)]dxdy$$

$$L'(\delta)=\int 2\beta(P-H_{u_0}(u_0))H_{u_0}(\delta)dxdy.$$

48. The method of claim 35 where the equation is solved in terms of a set of splines.

49. The method of claim 48 where the splines are piecewise quadratic.

50. The method of claim 48 where each spline has compact support over a different subset of the grid elements.

51. The method of claim 35 where the boundary conditions of the equation are less than fully clamped.

52. The method of claim 51 where the boundary conditions are free.

53. The method of claim 35 where the triangulation grid is a uniform type II grid.

54. A machine-readable medium bearing instructions for causing a digital computer to execute the method of claim 35.

* * * * *

UNITED STATES PATENT AND TRADEMARK OFFICE
CERTIFICATE OF CORRECTION

| | | |
|---|---|---|
| PATENT NO. | : 7,044,601 B2 | Page 1 of 1 |
| APPLICATION NO. | : 11/186468 | |
| DATED | : May 16, 2006 | |
| INVENTOR(S) | : Wang et al. | |

It is certified that error appears in the above-identified patent and that said Letters Patent is hereby corrected as shown below:

In column 8, line 53, delete "xy." and insert -- x,y. --, therefor.

In column 11, line 32, Delete "$a^2+y^2$" and insert -- $x^2+y^2$ --, therefor.

In column 11, line 56, delete " $A(u_0)^2 = H_{u0}(u_0)^2 - K_{u0}(u_0)$ " and insert -- $A(u_0)^2 = H_{u0}(u_0)^2 - K_{u0}(u_0)$, --, therefor.

In column 15, line 11, in Claim 20, delete "tone." and insert -- toric. --, therefor.

In column 15, line 15, in Claim 22, delete "B($\delta$v)" and insert -- B($\delta$,v) --, therefor.

In column 16, line 25, in Claim 42, after "deviation" insert -- weight --.

In column 16, line 36, in Claim 46, delete "B($\delta$v)" and insert -- B($\delta$,v) --, therefor.

In column 16, line 39, in Claim 47, delete "claim 45" and insert -- claim 46 --, therefor.

Signed and Sealed this

Twenty-eighth Day of November, 2006

JON W. DUDAS
*Director of the United States Patent and Trademark Office*